(12) United States Patent
Tran et al.

(10) Patent No.: US 6,323,480 B1
(45) Date of Patent: Nov. 27, 2001

(54) RESONANT PHOTODETECTOR

(75) Inventors: Dean Tran, Westminster; Edward A. Rezek, Torrance; Eric R. Anderson, Redondo Beach; William L. Jones, Inglewood, all of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/238,817

(22) Filed: Jan. 28, 1999

(51) Int. Cl.[7] ............................................ H01L 31/0232
(52) U.S. Cl. ...................... 250/214.1; 257/432; 257/436; 385/14
(58) Field of Search .................... 250/214.1; 257/184, 257/432, 436; 385/14; 216/24

(56) References Cited

U.S. PATENT DOCUMENTS

| | | |
|---|---|---|
| 5,038,356 | 8/1991 | Botez et al. |
| 5,253,263 | 10/1993 | Jansen et al. |
| 5,455,421 | 10/1995 | Spears. |
| 5,459,332 | 10/1995 | Carruthers. |
| 5,602,393 | 2/1997 | Gerard. |
| 5,701,374 * | 12/1997 | Makiuchi ............................... 385/14 |
| 5,883,988 * | 3/1999 | Yamamoto et al. ................... 385/14 |
| 6,049,638 * | 4/2000 | Norimatsu et al. ................... 385/14 |

FOREIGN PATENT DOCUMENTS 3-290606 * 12/1991 (JP).

* cited by examiner

Primary Examiner—F. L Evans
(74) Attorney, Agent, or Firm—Harness, Dickey & Pierce, P.L.C.

(57) ABSTRACT

A resonant photodetector assembly (10) which uses multiple reflections of light within a photodetector (20) to convert input light into an electrical signal. The photodetector (20) includes a combination of generally planar semiconductor layers including a photodetector active layer (36) where light is converted into an electrical output. The photodetector (20) further includes a first outer electrical contact layer (34) and a second outer electrical contact layer (42). A waveguide (22) is positioned on the photodetector (20) and has a waveguide active layer (26) positioned between a pair of waveguide cladding layers (24, 28), a first end (30) for receiving input light and a second end (50) for reflecting the light. A reflector (32) is positioned on the second end (50) of the waveguide (22) at an angle relative to a line parallel to the substrate (14), where the reflector (32) reflects the light received by the first end (30) of the waveguide active layer (26) towards the photodetector (20). A reflector (38) is positioned on the second outer layer (42) of the photodetector (20) and provides a reflective surface for reflecting the light within the photodetector (20).

17 Claims, 2 Drawing Sheets

RESONANT PHOTODETECTOR

BACKGROUND OF INVENTION

1. Field of the Invention

This invention relates generally to semiconductor photodetectors and, more specifically, to a resonant semiconductor photodetector that is able to generate an electrical output for a wide range of electromagnetic frequencies using a waveguide reflector and a semiconductor reflector to create a resonance of light within the photodetector active area.

2. Discussion of the Related Art

High frequency photodetectors, such as PIN photodiodes, that are used in a variety of systems for the transfer of light as a primary means of transferring information are known in the art. These systems are especially needed for high-speed communication systems, such as automatic teller machines, computer network systems, and multimedia applications.

Photodetectors are used to convert optical energy into an electrical energy. A photodiode is typically used for high-speed applications. In high-speed applications, the speed and the responsivity of the photodetector are critical. Although fiber optic cable can transmit at speeds greater than 100 GHz, current technology photodetectors are limited to 45–60 GHz bandwidths. With the current explosion of multimedia technologies and applications, such as the Internet, the telecommunications industry will require higher bandwidth systems, such as optical systems with high speed photodiodes.

In the typical photodiode, an active semiconductor material generates an electrical current by the photogenerated electrons within the active material. Responsivity and speed are two variables that are often used to determine the performance of photodetectors. Responsivity is the measure of the effectiveness of a device in converting incident light to an output current. Speed is the measure of how quickly an output of the device changes in response to a change in the input to the device. For a photodiode to be effective in high-speed communication applications, it must have both a high responsivity and a high speed. Current high speed photodiodes typically have a responsivity of 0.2–0.4 amps/watt and a top end speed of 45–60 GHz. To increase the responsivity of a photodiode, the thickness of the active area is often increased so as to increase the quantum efficiency, thus creating more output current. This creates a problem, however, because the thicker the active area, the longer the transmit time, which decreases the speed.

Current high speed photodiode design incorporates a tradeoff between quantum efficiency and bandwidth.

Most communication applications that involve photodiodes also require an optical coupling device for guiding the light to the photodiode active area. Since the requirements of the optical coupling device are to deliver the incident light to a relatively small area, typically there are a number of components and materials that are required to carry out this task. Due to the difference of materials and the number of optical components that are used in the optical coupling device, there tends to be a high optical loss in the coupling device that degrades the overall performance of the photodiode.

State of the art optical communication systems have carriers of very high frequency that require the use of high speed, high responsivity photodetectors. As the demand for more information increases, so will the demand that communication systems be able to transmit more information, which will in turn require high-speed high responsivity photodetectors. The known photodetectors for high frequency applications are limited by having a low responsivity and a limited high-end frequency response. It has been recognized that the effectiveness of a communications system could be increased by providing a photodetector that employs multiple reflections between a waveguide and reflectors to produce a high response and high-speed photodetector.

It is an object of the present invention to provide a resonant photodetector that provides for an increased responsivity and speed, as well as providing other improvements, over the known photodetectors, to improve the performance of the communication process.

SUMMARY OF THE INVENTION

In accordance with the teachings of the present invention, a resonant photodetector assembly is disclosed that utilizes multiple reflections within a photodetector to convert an optical signal to a corresponding electrical output. The resonant photodetector assembly includes a waveguide, a first reflector, a photodetector, a second reflector and supporting structure.

The waveguide provides a path to direct light to the photodetector from a light source. The waveguide includes a first end that provides a connection point to a light source. This single element reduces the number of optical components required to direct the light to the photodetector. The waveguide further includes cladding layers that refract the light to prevent the light from escaping from the waveguide while propagating towards the photodetector. The first reflector and the second reflector provide for multiple reflections of the light propagating through the photodetector. This use of multiple reflections within the photodetector allows for a thinner active area to be used in the photodetector. A thin active area is required for high speed operation, the use of multiple reflections through the active layer provides high speed while retaining or increasing the efficiency of operation.

Additional objects, advantages and features of the present invention will become apparent from the following description and appended claims, taken in conjunction with the accompanying drawings.

DETAILED DESCRIPTION OF THE PREFERRED EMBODIMENTS

The following discussion of the preferred embodiments of the invention directed to a resonant photodetector assembly is merely exemplary in nature, and is in no way intended to limit the invention or its applications or uses. For example, the description of the resonant photodetector assembly of the invention will be described in connection with a monolithic microwave integrated circuit (MMIC). However, the resonant photodetector assembly of the invention may have application for other types of photodetectors or associated circuitry.

Figure 1:
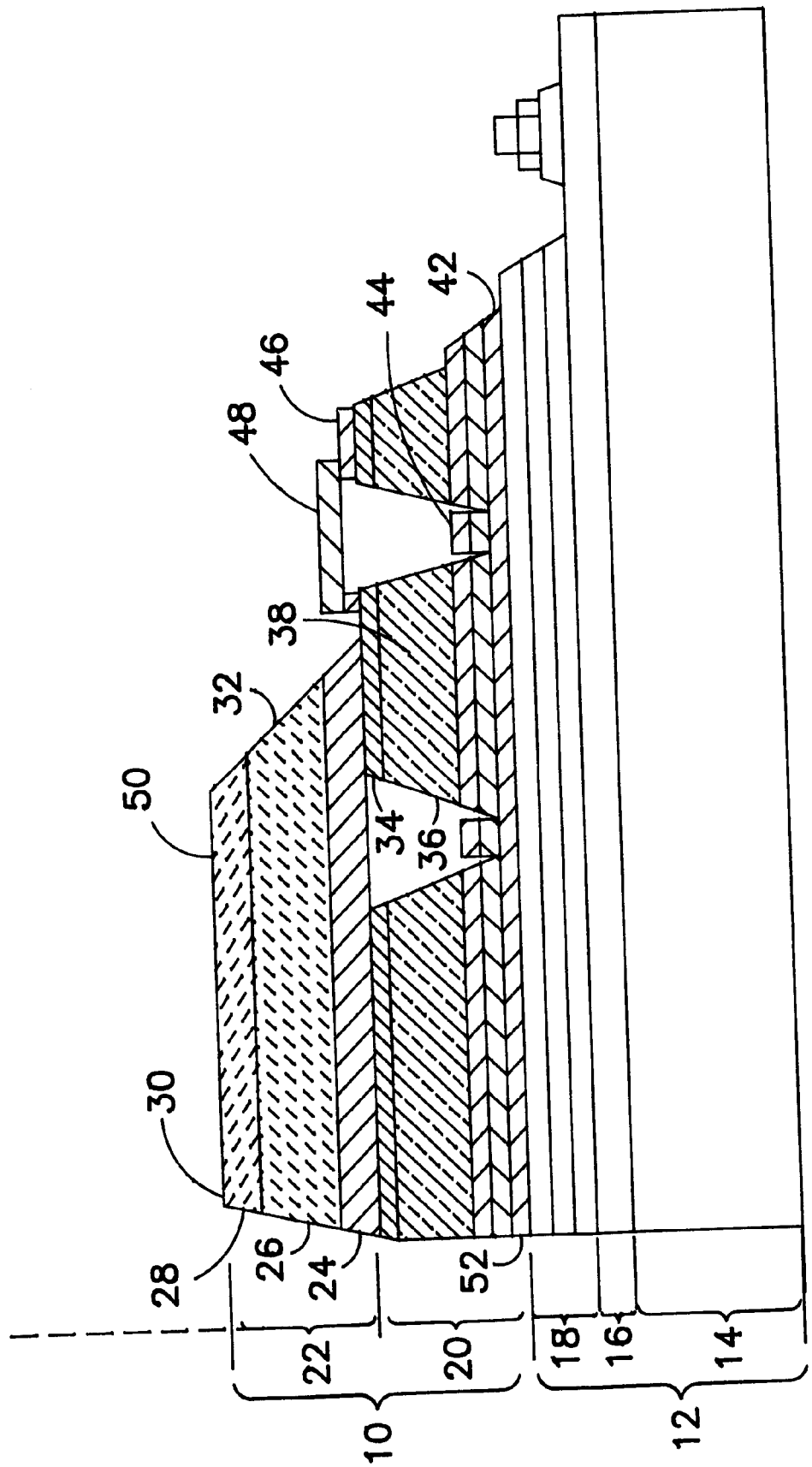
FIG. 1 is a sectional view of one preferred embodiment of the resonant photodetector of the present invention.
Figure 2:
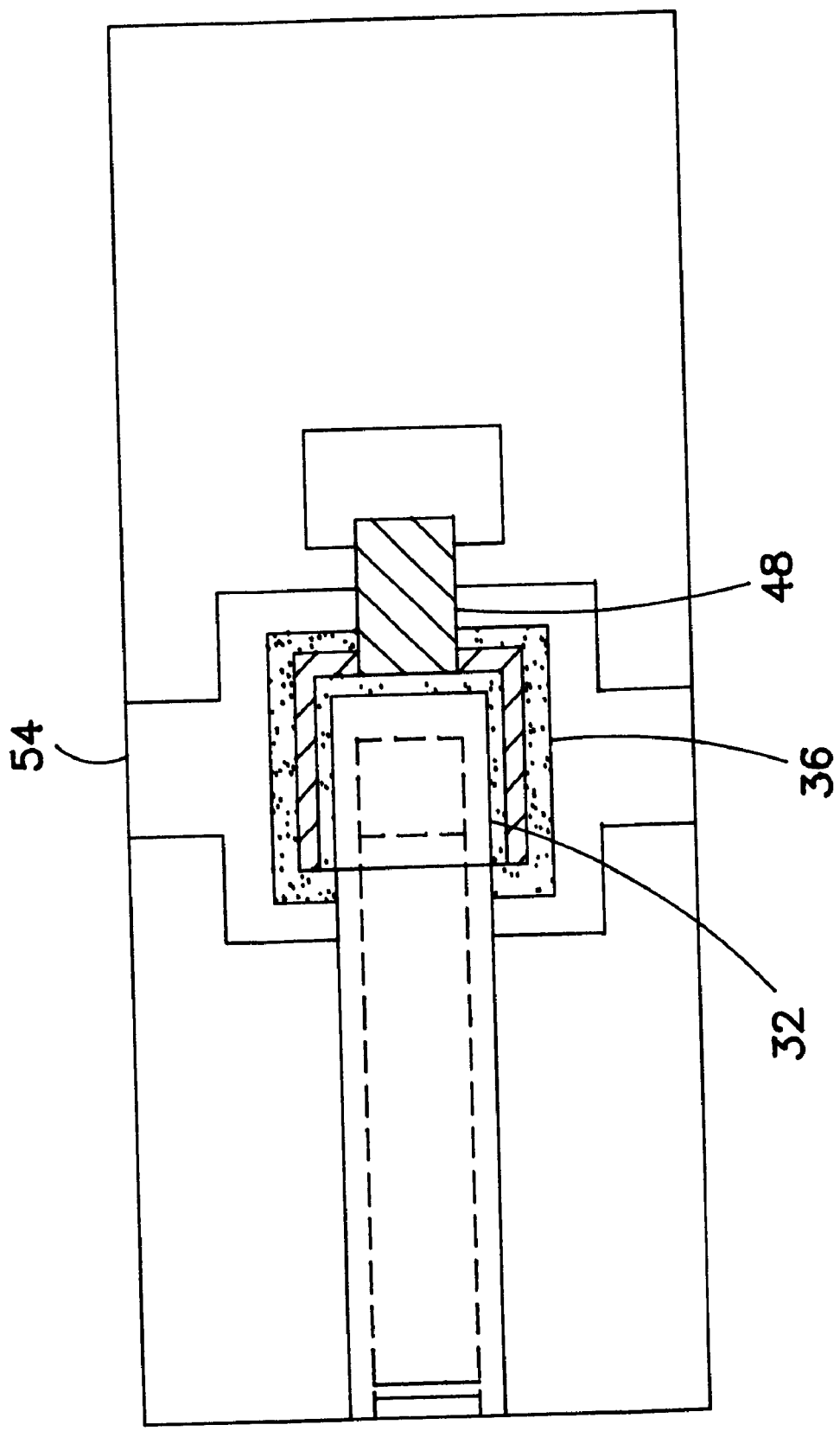
FIG. 2 is a top view of one preferred embodiment of the resonant photodetector of the present invention.

FIG. 1 shows a cross-sectional view and FIG. 2 shows a top view of a resonant photodetector assembly 10. The resonant photodetector assembly 10 is a combination of semiconductor layers defining a semiconductor supporting structure 12 that includes a substrate layer 14, a buffer layer 16 and a stop etch layer 52. A photodetector 20 and a waveguide 22, in combination with other semiconductor layers, are formed on the supporting structure 12, as will be described below. Light collected by the waveguide 22 is directed to the photodetector 20 where it is converted to an electrical signal. The electrical signal is then conveyed to a MMIC 18 where various operations can be performed upon the signal as would be understood to those skilled in the art. The semiconductor layers of the MMIC 18 form part of the structure 12.

The waveguide 22 includes a waveguide active layer 26 surrounded by an upper waveguide cladding layer 28 and a lower waveguide cladding layer 24. A first end 30 of the waveguide 22 receives the light to be detected from a light source (not shown). The light is channeled down the active layer 26 by reflections off of the cladding layers 24 and 28 to a reflective second end 50 of the waveguide 22 defining a waveguide reflector 32. In one embodiment, the first end 30 is formed at an 8 degree angle relative to a line perpendicular to the substrate layer 14, and the second end 50 is formed at an angle 36–53 degree relative to a line parallel to the substrate layer 14. As will be appreciated by those skilled in the art other suitable formation angles can be used.

In one embodiment, the waveguide active layer 26 is composed of InGaAsP and both waveguide cladding layers 24 and 28 are composed of InP. However, as will be appreciated by those skilled in the art, other semiconductor materials that are suitable for light propagation can be used. The waveguide active layer 26 can transmit a wide spectrum of light. The first end 30 is coated with an anti-reflective dielectric material so that incident light from the light source does not get reflected from the first end 30. The reflector 32 has a highly reflective gold coating or other high reflectivity material coating for reflecting light from the waveguide active layer 26 to the photodetector 20.

The photodetector 20 includes a photodetector active layer 36 positioned above a semiconductor reflector layer 38. A p-contact layer 34 is the top outermost layer of the photodetector 20 and is positioned between the waveguide 26 and the photodetector active layer 36. An n-contact layer 42 is the bottom outermost layer of the photodetector 20, and is located between the semiconductor reflector layer 38 and the stop etch layer 52. The light from the waveguide 22 is reflected off of the reflector 32 into the photodetector 20. The photodetector active layer 36 absorbs most of the light passing through the layer 36 and converts the absorbed light into an electrical signal. The light that is not converted by the photodetector active layer 36 is reflected off of the semiconductor reflector layer 38 and directed back through the photodetector active layer 36 for another chance to be absorbed. The unabsorbed light continues to be reflected between the semiconductor reflector layer 38 and the reflector 32 of the waveguide 22 until it is eventually absorbed by the photodetector active layer 36.

Due to the maximum utilization of the light input by the resonant photodetector assembly 10, a much thinner photodetector active layer 36 is required to convert the light into electrical current than a typical photodetector known in the art. In one embodiment of the invention, the area of the photodetector active layer 36 is about 9 $\mu m^2$. Having a smaller active area increases the speed of the photodetector. In the present embodiment of the invention, the responsivity of the photodetector 20 is about 1 amp/watt compared to the maximum response of 0.2–0.4 amp/watt for a photodetector known in the art. The photodetector 20 can convert light with a bandwidth greater than 100 GHz. Typical photodetectors known in the art can only convert light at a bandwidth of up to 45–60 GHz.

In one embodiment, the photodetector 20 is a PIN type photodiode, but other types of photodetectors may be used. The photodetector active layer 36 is composed of three layers, including a lightly p-doped InGaAs layer, an intrinsic InGaAs layer and an undoped InP layer for reducing the drift current. The semiconductor reflector layer 38 is a Bragg reflector, and consists of a series of alternating layers of n-doped GaP and GaInP layers. To achieve maximum reflectivity, the semiconductor reflector 38 has thirty-six alternating layers, although different materials and numbers of layers may be used.

In one embodiment, the p-contact layer 34 is a heavily p-doped InGaAs layer and the n-contact layer 42 is a heavily n-doped InP layer. Referring to FIG. 2, the n-contact 54 and its associated metal work form a layer on the resonant photodetector assembly 10 surrounding the raised photodetector structure. The p-contact 46 is positioned on a raised portion of the photodetector 20, and a gold airbridge 48 connects the p-contact layer 34 on the photodetector 20 with the p-contact 46 on the raised portion of the photodetector 20. The n-contact 44 operates in conjunction with the p-contact 46 to conduct the electrical output of the photodetector 20 to the MMIC 18.

The stop etch layer 52 is located immediately below the n-contact 44 of the photodetector 20. In one embodiment of the invention, the stop etch layer 52 is made of quaternary InGaAsP. The MMIC 18 is located immediately below the stop etch layer 52 and consists of a number of layers. The MMIC 18 is well known in the art, and in the preferred embodiment the MMIC 18 consists of high electron mobility transistors (HEMT). The buffer layer 16 is located immediately below the layers that define the MMIC 18 and is made of InP. The substrate 14 is located immediately below the buffer layer 16 and is made of semi-insulating InP.

The formation of the resonant photodetector assembly 10 follows conventional fabrication techniques. In one embodiment, the method to fabricate the semiconductor layers of the assembly includes the steps as follows: formation of the n-contact layer 42 of heavily n doped InP with a thickness of 1 $\mu$m; formation of the semiconductor reflector layer 38 having a number of n doped layers where the number and thickness of the layers are selected to provide the desired reflectivity; formation of the photodetector active layer 36 including an undoped InP layer with a thickness of 0.2 $\mu$m to 5 $\mu$m an intrinsic InGaAs layer with a (critical) thickness of 100 Å to 140 Å, and a p doped InGaAs layer with a thickness about 1 $\mu$m; formation of the photodetector p-contact layer 34 of heavily p doped InGaAs with a thickness about 0.2 $\mu$m; formation of the waveguide cladding layer 24 of undoped InP with a thickness about 3 $\mu$m; formation of the waveguide active layer 26 of undoped InGaAsP with a thickness about 4 $\mu$m; and formation of the waveguide cladding layer 28 of undoped InP with a thickness about 3 $\mu$m.

After growing the required layers for the resonant photodetector assembly 10, the resulting structure is processed by conventional techniques to define the necessary structures. These steps include forming an angle on the second end 50 of the waveguide 22 by using photolithography and wet chemical etching technique; forming the waveguide 22 using photolithography and a dry etching technique; forming the photodetector 20 using a wet selective etching technique; constructing the interconnections for the p-contact 46 and the n-contact 44, including the airbridge 48; adding a highly reflective coating to the second end 50 of the waveguide 22 creating the reflector 32; and forming an angle on the first end 30 of the waveguide 22 with a cleave and lap edge and coating the first end 30 of the waveguide 22 with an anti reflective dielectric.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A resonant photodetector assembly comprising:
    a substrate;
    a photodetector positioned on the substrate, said photodetector having a plurality of generally planar semiconductor layers including a photodetector active layer where light is converted into an electrical output, said photodetector including a first electrical contact layer and a second electrical contact layer; and
    a waveguide positioned on said substrate and adjacent to the photodetector, said waveguide having a waveguide active layer positioned between a pair of waveguide cladding layers, said waveguide including a first end for receiving said light and a second end for directing said light to the photodetector; and
    a first reflector for reflecting the light from the waveguide, said first reflector being positioned on a side of the photodetector opposite to the waveguide so that the light from the waveguide travels through the photodetector active layer before being reflected by the first reflector.

2. A resonant photodetector assembly according to claim 1 wherein the waveguide includes a second reflector positioned on the second end of the waveguide at an angle relative to the waveguide active layer, where the second reflector reflects the light received by the first end of said waveguide active layer towards the photodetector.

3. A resonant photodetector assembly according to claim 2 wherein the second reflector is positioned at an angle of about 36 to 53 degrees relative to the waveguide active layer and is a highly reflective gold mirror.

4. A resonant photodetector assembly according to claim 1 wherein the first reflector is a reflective semiconductor layer.

5. A resonant photodetector assembly according to claim 1 wherein the first reflector is a Bragg reflector including a series of alternating semiconductor layers.

6. A resonant photodetector assembly according to claim 1 wherein the pair of waveguide cladding layers are made of InP, the waveguide active layer is made of InGaAsP and the first end of said waveguide is cleaved, edge lapped and polished.

7. A resonant photodetector assembly according to claim 1 wherein the photodetector active layer is located between the first electrical contact layer and the first reflector and includes an intrinsic layer of InGaAs located between a p-doped InGaAsP layer and the first reflector, and an undoped inP layer located between the intrinsic layer of InGaAs and the first reflector.

8. A resonant photodetector assembly according to claim 1 wherein the photodetector active area included multiple quantum wells with intrinsic InP spacing layers.

9. A resonant photodetector assembly according to claim 1 wherein the substrate is part of a semiconductor supporting structure positioned adjacent to the photodetector opposite from the waveguide, said supporting structure further including a stop etch layer and a buffer layer.

10. A resonant photodetector assembly according to claim 1 wherein a p-contact layer and a n-contact layer are electrically coupled to the photodetector active layer, wherein said p-contact layer corresponds to the first outer contact layer of said photodetector and has a p-contact and said n-contact layer corresponds to the second contact layer of said photodetector and has an n-contact.

11. A resonant photodetector assembly according to claim 10 wherein the p-contact and the n-contact are operatively coupled to an integrated circuit for sending an electrical output to the integrated circuit.

12. A resonant photodetector assembly comprising:
    a substrate;
    a photodetector positioned on the substrate, said photodetector having a plurality of generally planar semiconductor layers including a photodetector active layer where light is converted into an electrical output, said photodetector including a first electrical contact layer and a second electrical contact layer; and
    a waveguide positioned on said substrate and adjacent to the photodetector, said waveguide having a waveguide active layer positioned between a pair of waveguide cladding layers, said waveguide including a first end for receiving said light and a second end for directing said light to the photodetector; wherein the first end of said waveguide is configured at an angle relative to a line perpendicular to the waveguide active layer and further includes a dielectric anti-reflective coating facing a source of said light.

13. An resonant photodetector assembly comprising:
    a semiconductor support structure having a combination of semiconductor layers including a substrate and a buffer layer positioned on said substrate;
    a photodetector positioned on said semiconductor support structure and having a combination of generally planar semiconductor layers including a photodetector active layer where light is converted into an electrical output, said photodetector including a first outer electrical contact layer and a second outer electrical contact layer;
    a waveguide positioned on said photodetector and having a waveguide active layer located between a pair of waveguide cladding layers, said waveguide including a first end for receiving said light, said first end including an anti-reflective dielectric coating facing a source of light, said waveguide further including a second end for directing said light to the photodetector;
    a first reflector positioned on said second end of said waveguide where said first reflector is positioned at an angle relative to the waveguide active layer, said first reflector reflecting the light received by said first end of said waveguide layer towards said photodetector; and a second reflector positioned on said second electrical contact layer of said photodetector to reflect the light that has passed through the photodetector active layer back through the photodetector active layer.

14. A resonant photodetector assembly according to claim 13 wherein the photodetector active layer includes a p-doped InGaAs layer located between a p-contact layer and the second reflector, the photodetector active layer further including an intrinsic layer of InGaAs located between the p-doped InGaAs n layer and the second reflector and an undoped InP layer located between the intrinsic layer of InGaAs and the second reflector.

15. A resonant photodetector assembly according to claim 13 wherein the pair of waveguide cladding layers are made of InP, the waveguide active layer is made of InGaAsP, and the first end of the waveguide is cleaved and edge lapped and defines an 8 degree angle.

16. A resonant photodetector assembly according to claim 13 wherein the second reflector is a Bragg reflector including a series of alternating semiconductor layers.

17. A resonant photodetector assembly according to claim 13 wherein the photodetector active layer has an area of about 9 $\mu m^2$.

* * * * *